United States Patent
Zhao

(10) Patent No.: US 7,562,000 B2
(45) Date of Patent: Jul. 14, 2009

(54) ELECTROMAGNETIC SIMULATOR SYSTEMS AND METHODS

(75) Inventor: Jinsong Zhao, Milpitas, CA (US)

(73) Assignee: Lorentz Solution, Inc., Milpitas, CA (US)

( * ) Notice: Subject to any disclaimer, the term of this patent is extended or adjusted under 35 U.S.C. 154(b) by 499 days.

(21) Appl. No.: 11/122,559

(22) Filed: May 4, 2005

(65) Prior Publication Data

US 2005/0251378 A1 Nov. 10, 2005

Related U.S. Application Data

(60) Provisional application No. 60/568,312, filed on May 4, 2004, provisional application No. 60/568,311, filed on May 4, 2004.

(51) Int. Cl.
G06F 17/50 (2006.01)
G06F 17/10 (2006.01)

(52) U.S. Cl. .................... 703/14; 703/2

(58) Field of Classification Search ............. 703/2, 703/13–16; 716/4–6
See application file for complete search history.

(56) References Cited

U.S. PATENT DOCUMENTS 6,051,027 A * 4/2000 Kapur et al. .............. 703/5
6,353,801 B1 * 3/2002 Sercu et al. ............. 702/65
6,513,001 B1 * 1/2003 Kapur et al. ............ 703/13
7,149,666 B2 * 12/2006 Tsang et al. ............. 703/2
2005/0251377 A1 * 11/2005 Zhao ..................... 703/14

OTHER PUBLICATIONS

Smedes et al., T. Extraction of Circuit Models for Substrate Cross-Talk, Proceedings of the 1995 IEEE/ACM Int. Conference on Computer-Design, Dec. 1995, pp. 1-8.*
Cao et al., A PEEC with a New Capacitance Model for Circuit Simulation of Interconnects and Packaging Structures, IEEE Transactions on Microwave Theory and Technology, vol. 48, No. 2, Feb. 2000, pp. 281-287.*

* cited by examiner

Primary Examiner—Russell Frejd
(74) Attorney, Agent, or Firm—Venture Pacific Law, PC

(57) ABSTRACT

The present invention provides methods and apparatuses for an electromagnetic simulator. The method for circuit simulation comprises the steps of discretizing the circuit element into charge elements and current elements, generating internal data structures to include the charge elements and current elements wherein the internal data structures include Mixed-Potential Integral Equation Green's functions and Partial Element Equivalent Circuit (PEEC) incident matrixes, and calculating relationship between the charge elements and current elements using multilayer Green's function to provide electromagnetic interactions in the internal data structures.

17 Claims, 4 Drawing Sheets

ELECTROMAGNETIC SIMULATOR SYSTEMS AND METHODS

CROSS REFERENCE

This application claims priority from a provisional patent application entitled "Circuit-Based Electromagnetic Simulation for Efficient High-Frequency Modeling" filed on May 4, 2004, having a Provisional Patent Application No. 60/568,312; and a provisional patent application entitled "Electromagnetically Enhanced Circuit Simulator" filed on May 4, 2004, having a Provisional Patent Application No. 60/568,311. These applications are incorporated herein by reference.

FIELD

The present invention relates to circuit simulation and, more particularly, to methods and apparatuses for an electromagnetic circuit simulator.

BACKGROUND

Integrated circuits manufactured in a silicon process, when operating in high-frequency ranges (e.g. 300 MHz to 20 GHz), have significant high-frequency effects among the passive structures. The passive structures include spiral inductors made from metal conductors and interconnects between devices. Intentional devices, such as inductors and transformers, are modeled through parameter extraction, in which the essential circuit parameters are obtained through complex steps of analyzing the underlying physics. Unintentional structures, such as interconnects that link devices together for certain functions, are modeled through parasitic extraction, in which the self-terms or mutual-terms are computed through the similar complex steps of analyzing the underlying physics.

At high-frequency ranges, the distinction of parameter extraction and parasitic extraction is blurred, due to the strong couplings between passive devices and passive interconnects. In order to account for the total effects, a versatile yet efficient extraction or simulation tool for passive structures is necessary. Efficiency of the tool, preferably an interactive one, is essential for the design productivity.

It is well known that electromagnetics is the underlying physics that govern passive devices, yet the traditional full-wave implementation is extremely slow and often running from hours to days for a simple extraction problem. One widely used method in solving the electromagnetic equations in a layered media is the Mixed-Potential Integral Equation (MPIE) method, described by S. M. Rao, et al, in IEEE Transactions on Antennas and Propagation, 30(3):409-418, May, 1982, and entitled "Electromagnetic Scattering by Surfaces of Arbitrary Shape."

Traditionally, this method is implemented in a 2.5 D simulation context where the conductor is assumed to be infinitely thin. This assumption is reasonably valid in microwave circuits where the width/thickness ratio is relatively large. However, such assumption becomes increasingly invalid for integrated circuits where the conductor thickness can be on the same order of the width. One serious defect in the popular rooftop triangular current basis function is the high matrix condition number at low frequencies, making the method unstable for broadband modeling applications. The curl-free and divergence-free decomposition method reduced the condition number at a cost of high implementation difficulty and disassociation with the circuit concepts. The method is discussed in S. Kapur, et al. in U.S. Pat. No. 6,513,001, entitled Efficient Electromagnetic Full-Wave Simulation In Layered Semiconductor Media.

Another widely popular theoretical approach is the Partial Element Equivalent Circuit (PEEC) of A. E. Ruehli, discussed in IEEE Transactions on Microwave Theory and Techniques, 40(7):1507-1516, July 1992 and entitled "Circuit models for three-dimentional geometris including dielectrics." (Note that references to PEEC herein are general references to partial-element-equivalent-circuit methods and is not intended to be limited to one particular type of PEEC method.) PEEC method discretizes the MPIE problem into an equivalent circuit of vast number of partial elements. Even though in theory PEEC is an integral equation solving implementation that closely relates the electromagnetic problem to a circuit approximation, its practical use is very limited in high-frequency IC passive structure modeling due to prohibitively high computing cost needed to arrive at a reasonable solution. Partial capacitances and partial inductances are computed by methods such as those proposed by K. Nabors, et al, in a publication entitled A Multipole Accelerated 3-D Capacitance Extraction Program published in IEEE Transactions On Computer-Aided Design Of Integrated Circuits And Systems, 10(11): 1447-59, November 1991 and by M. Kamon, et al, in a publication entitled A Multipole-Accelerated 3-D Inductance Extraction Program published in IEEE Transactions On Microwave Theory And Techniques, 42(9): 1750-8, September 1994.

Yet it is further understood that as frequency increases, the retardation of the electromagnetic influence must be considered to account for the time delay in the electromagnetic coupling because of vastly complex PEEC elements. This would further limit the applicability of PEEC in high-frequency circuit modeling. A need thus arises to incorporate certain electromagnetic behaviors directly into a circuit simulation context. Jandhvala, et al. in a publication entitled A Surface Based Integral Equation Formulation for Coupled Electromagnetic and Circuit Simulation published in Microwave Optical Technology Letters, Vol 34, No. 2, pp. 102-106, Jul. 20, 2002, attempt to use a slightly more high-order discretization scheme, the surface-based integral equation formulation, to link the circuit simulation with electromagnetic simulation, yet its use of the free-space Green's function causes it to suffer from the same limited usefulness as the traditional PEEC method.

Accordingly, what is needed is a method and apparatus that reduces the electromagnetic simulation in layered media into a similar PEEC discretization without the complexity of the full 3D discretization of dielectric and substrate as required by the traditional PEEC method, and yet fully accounts for the electromagnetic effects including the substrate eddy current loss and displacement loss. Moreover, it should closely relate to the circuit concepts such as voltage, current, and affords an easy way of integrating with traditional circuit simulators.

SUMMARY OF THE INVENTION

The present invention provides an electromagnetic simulator that reduces the electromagnetic simulation of layered media into a circuit-based PEEC discretization and accounts for electromagnetic effects including substrate eddy current loss and displacement loss. The electromagnetic simulator relates to basic circuit concepts of voltage and current that affords integration with traditional circuit simulators. Accordingly, an embodiment of the present invention provides a method for simulating a circuit element. The method comprises discretizing the circuit element into charge elements and current elements, generating internal data structures to include the charge elements and the current elements wherein the internal data structures include Mixed-Potential Integral Equation Green's functions and Partial Element Equivalent Circuit (PEEC) incident matrixes, and calculating relationship between the charge elements and current elements using multilayer Green's function to provide electromagnetic interactions in the internal data structures.

In accordance to another embodiment of the present invention, the step of generating an internal data structures includes generating a row of full current element equations.

In accordance to another embodiment of the present invention, the step of generating an internal data structures includes generating a row of charge conservation equations.

In accordance to another embodiment of the present invention, the step of generating an internal data structures includes generating a row of node voltage and auxiliary equations for modified nodal analysis.

The rows of full current element equations, charge conservation equations, and node voltage and auxiliary equations for modified nodal analysis can be combined into matrix.

In accordance to another aspect of the present invention, the steps of discretizing, generating, and calculating provides a system matrix.

In accordance to another aspect of the present invention, the system matrix includes at least one submatrix for the electromagnetic interactions.

In accordance to yet another aspect of the present invention, the method includes compressing the submatrix.

In accordance to yet another aspect of the present invention, the method includes matrix-stamping the internal data structures to provide the system matrix.

Other aspects and advantages of the present invention will become apparent to those skilled in the art from reading the following detailed description when taken in conjunction with the accompanying drawings.

DETAILED DESCRIPTION

Figure 1:
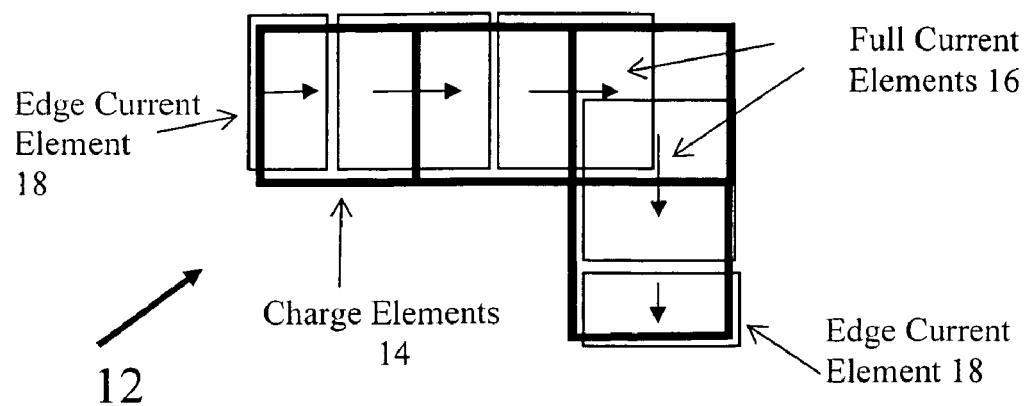
FIG. 1 is an illustration of an example L-shaped conductor.

As described below, the present invention provides methods and apparatuses for an electromagnetic simulator. The present invention reduces the electromagnetic simulation of layered media into a circuit-based Partial Element Equivalent Circuit (PEEC) discretization without the complexity of a full 3D discretization of dielectric and substrate as required by traditional PEEC methods, yet the present invention accounts for the electromagnetic effects including the substrate eddy current loss and displacement loss. By the introduction of charge variables as unknowns, difficulties encountered in the traditional electromagnetic simulation due to ill conditions at low frequencies are avoided. Moreover, the present invention closely relates to the circuit concepts such as voltage, current, and affords natural integration with traditional circuit simulators. A data caching mechanism further increases the efficiency of the electromagnetic simulator.

According to an embodiment of the present invention, the formulation is based on the Mixed-Potential Integral Equation, in which the electric fields $\vec{E}$ are expressed in terms of vector potential $\vec{A}$ and scalar potential $\phi$:

$$\vec{E} = -j\omega \vec{A} - \nabla \phi$$

where $\vec{A}$ can be computed through the application of the vector potential Green's function $G_A$ on the current distribution J, and scalar potential $\phi$ can be computed through the application of the scalar potential Green's function $G_\phi$ on the charge density $\rho$. Applying the above equation on conductor, the following equation holds at every conductor segment:

$$\frac{\vec{J}}{\sigma} + j\omega \vec{A} + \nabla \phi = 0$$

And by expanding the expression of $\vec{A}$ and $\phi$, $$\frac{\vec{J}(r)}{\sigma} + \int G_A(r, r') \vec{J}(r') + \nabla \int G_V(r, r') \rho(r') dr' = 0$$

where current density and charge density are bound by the charge conservation law. The difference between traditional PEEC and the present formulation is that in traditional PEEC, the Green's functions, $G_A$ and $G_\phi$, are free-space Green's functions, which require the discretization of entire 3D space, including the substrate and dielectric materials, to account for the effects of surrounding materials. According to an embodiment of the present invention, using specially developed multilayered Green's functions to account for the effects, the number of circuit equations are reduced.

By using the multilayered Green's functions, including the vector potential Green's functions and scalar potential Green's functions, the discretization is done on the conductors. Accordingly, the discretization method is as follows.

First, the surface of the conductor is discretized into panels with full coverage yet without overlapping, except at the conductor corner where for numerical convenience some overlapping is acceptable. The panels, in rectangular form or triangular form, are charge elements. According to an embodiment of the present invention, each panel holds a constant charge distribution.

Second, the conductor is discretized into filaments for 3D structures and panels for 2.5D structures along the interested current direction. These filaments or panels are current elements. For rectangular current elements, according to an embodiment of the present invention, each filament or panel has constant current following from one edge to the opposite edge in the current direction. Current elements are either full current elements whose current-flowing edges are internal, or edge current elements whose current-flowing edges are at the end of the conductor. Each charge element has at least one current element that has a current-flowing edge connected to it.

Referring to FIG. 1, an illustration of an example L-shape conductor path 12 is discretized into four charge segments 14, three full current elements 16, and two edge current elements 18. Each charge element 14 is overlapped with one or more current elements. Each charge element 14 has a constant voltage and charge distribution. By charge conservation law, the total amount of charge is determined by the sum of currents flowing out of the charge element and is expressed in the following formula.

$$0 = j\omega Q + \text{Total current flowing out}$$

The proper geometric organization of charge elements and current elements ensures that the total of charge elements covers the entire conductor surface without overlap, and that the total of current elements covers the entire conductor volume without overlap. Organized in such a manner affords the simulation to be most accurate.

Figure 2:
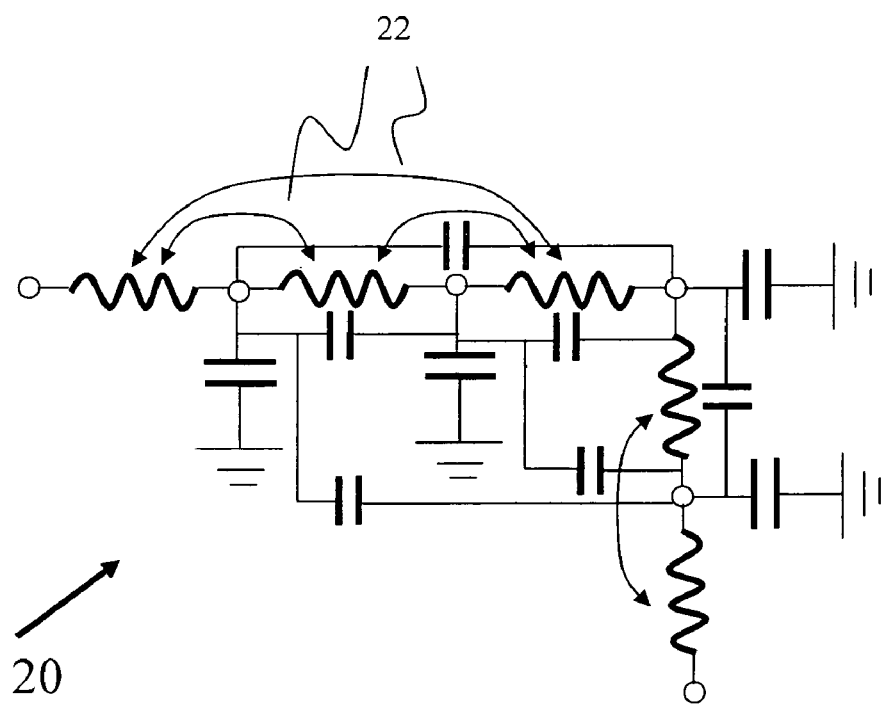
FIG. 2 is an illustration of an equivalent circuit for the L-shaped conductor of FIG. 1.

An equivalent circuit 20 constructed out of the discretization scheme is shown in FIG. 2. Each charge element is represented by a circuit node. A full mesh of capacitances exists among those nodes, including the self-capacitance from each node to ground node. Each current element represents a series of resistor and inductor; mutual inductances exist among these inductors.

The equivalent circuit 20 shows resistors and inductors for the L-shaped conductor path 12 of FIG. 1. The arrow lines 22 represent mutual inductance. Mutual inductances between two perpendicular segments are zero.

In the traditional PEEC method, inductances and capacitances are obtained explicitly after which an equivalent circuit is constructed. A disadvantage of the traditional PEEC method is that the inherent relationship between the vector potential and scalar potential is lost. In contrast, an embodiment of the present invention computes the inductances and capacitances from a combined system matrix. The construction of the combined system matrix begins with the use of the Mixed-Potential Integral Equation Green's functions, such as those formulated in a reference by J. Zhao, entitled Numerical and Experimental Modeling of Embedded Passive Elements for Wireless Applications, PhD thesis, University of California, Santa Cruz, December, 1997.

An assumption is made that there are $N_f$ full current elements, $N_h$ edge current elements (h stands for half), and $N_q$ charge elements. $N_c = N_f + N_h$ is the total number of current elements. Assuming the unknowns are current density on current elements (J), charge density on charge elements (Q), voltages on charge elements and circuit nodes (V), and voltage sources on certain circuit nodes ($V_S$), the matrix format for the system equations is:

$$\begin{bmatrix} -(R+j\omega L) & P_{LQ}\Phi & P_{LV} \\ S & j\omega & 0 \\ P_{VJ} & 0 & P_{VV} \end{bmatrix} \begin{bmatrix} J \\ Q \\ V \end{bmatrix} = \begin{bmatrix} 0 \\ 0 \\ V_S \end{bmatrix}$$

The first row represents the $N_f$ equations for full current elements and $N_h$ equations for edge current elements. R is a diagonal matrix whose diagonal value is the resistance of the current element. L is the inductance matrix representing the inductive couplings among $N_c$ current elements. The computation of inductance matrix uses the multilayered vector potential Green's function, with each element calculated as:

$$L_{ij} = \frac{1}{T_L} \int_{Ci} \int_{Cj} G_A(r, r') dr dr'$$

where $T_L$ is the scaling factor used in inductance computation and Ci Cj are the volumes of the observation current element and source current element respectively. For 3D conductive elements, $T_L$ is the product of cross section areas of both conductive elements. $\Phi$ is the scalar potential matrix, with each element calculated as:

$$\Phi_{ij} = \frac{1}{T_\phi} \int_{Qi} \int_{Qj} G_\phi(r, r') dr dr'$$

where $T_\phi$ is the scaling factor used in scalar potential integral computation, and Qi Qj are the areas of the observation charge element and source charge element respectively. $T_\phi$ is typically the area of the observation (corresponding to the i charge element) element. Q is the unknown coefficients for charge distribution, and thus $\Phi Q$ is the scalar potential, or voltage, on the charge elements due to the existence of Q charges. $P_{LQ}$ is the incidence matrix that indexes each current element equation to the voltage of the overlapping charge element. Similarly, $P_{LV}$ is the incidence matrix that indexes each current element equation to the voltage of the nodes that the edge current element is connected. Notice that although we express the equations in a matrix format, the actual implementation uses a stamping method that searches for the indices of the equation and indices of unknowns.

The second row represents the equations related to charge conservation. S is the incidence matrix that indexes the current elements that either flow into or flow out of the charge element.

The third row represents the equations related to node voltages and auxiliary equations for modified nodal analysis. For example, the edge current element is typically connected to a circuit node, and we would have an equation that makes the total current flowing out of the circuit node, including the current flowing out of the node and flowing into the edge current element, zero. $P_{VJ}$ and $P_{VV}$ are the two incidence matrix to index the corresponding edge currents and node voltages to the KCL equation.

Figure 3:
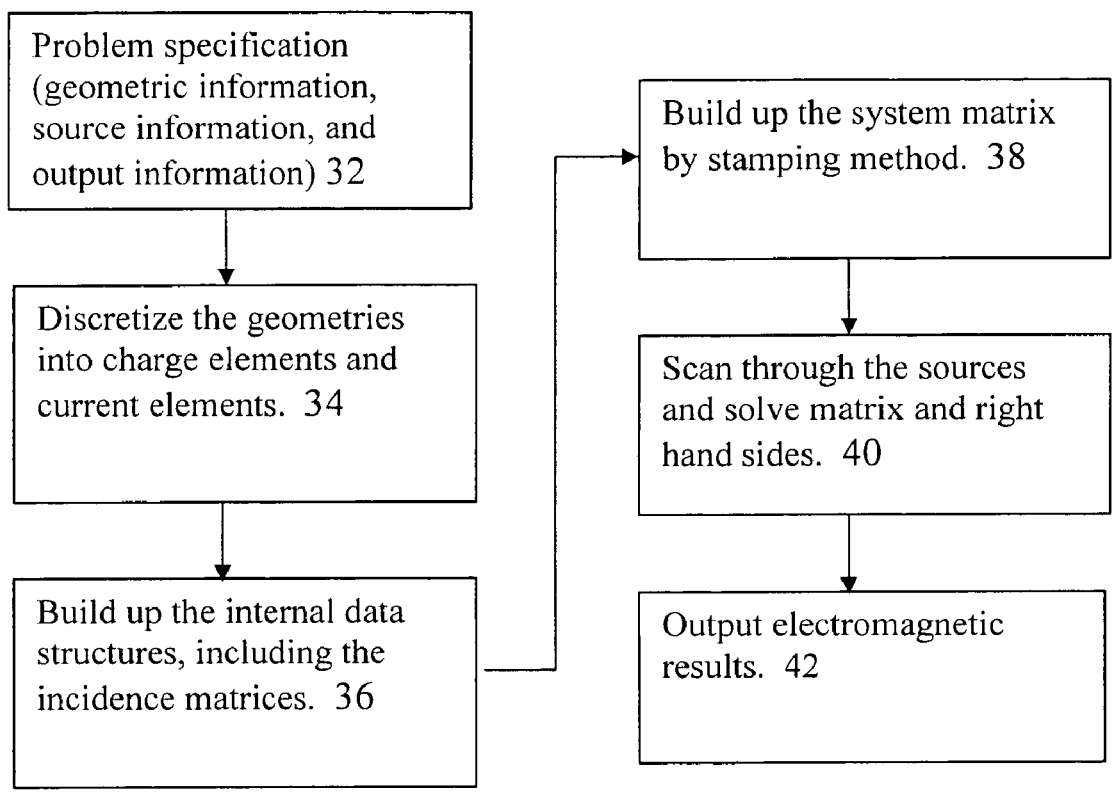
FIG. 3 is a flow diagram of a circuit-based electromagnetic simulator in accordance with an embodiment of the present invention.

FIG. 3 shows a flow diagram of a circuit-based electromagnetic simulation in accordance to an embodiment of the invention. The flow diagram begins with step 32 with a problem specification. The problem specification provides a description of a circuit with passive devices and includes geometric information, source information, and output information. In the next step 34, the passive devices are discretized, as a function of its geometric information, into charge elements and current elements. Next, in step 36, internal data structures are built which includes incidence matrices. In the next step 38, a system matrix is built using a stamping method in which contributions of each current element, charge element and other circuit elements to the system matrix are added based on element index and contribution value. Finally, in step 40, sources are scanned through and matrix and right hand sides are solved, and the electromagnetic results are generated 42. The introduction of specially organized charge elements and current elements with the application of the full-wave multilayered Green's function provides the foundation of the circuit-based electromagnetic simulation. User-defined geometries are discretized into essential elements that are used to generate the system matrix.

A system matrix can be either explicit whereby each matrix element is computed and stored in computer memory, or implicit whereby a computation routine for each matrix element is provided but the elements are only computed as-needed.

The novel formulation uses piece-wise constant basis functions that are simpler and easier to compute numerically compared to the rooftop basis functions used in S. Kapur, et al, U.S. Pat. No. 6,513,001 entitled Efficient Electromagnetic Full-Wave Simulation in Layered Semiconductor Media; and M. Kamon, et al, Fasthenry: A Multipole-Accelerated 3-D Inductance Extraction Program. IEEE Transactions on Microwave Theory and Techniques, 42(9): 1750-8, September 1994.

Traditional MPIE formulation uses currents as the unknowns to save on the number of unknowns; however, the ill-condition due to the existence of curl-free current elements makes the system unstable at low frequencies. The formulation in S. Kapur, et al. attempts to relieve the ill-condition by decomposing the current distribution into curl-free and divergence-free parts. According to a present embodiment of the present invention, the novel formulation solves the ill-condition problem at low frequency in a consistent manner.

At low frequency, due to diminished capacitive effects, the system degenerates itself to the magnetostatic extraction problem with no difficulty of system matrix ill-conditioning. Magnetostatic problem assumes the system property is substantially determined by current distribution and the related inductive couplings. Similarly, if we set matrix L to be zero, the system degenerates itself to the electrostatic extraction problem in which the system is substantially determined by charge distribution. Accordingly, the novel formulation is suitable for frequencies from 0 to high frequencies so long as the Green's functions are accurate. In accordance to another embodiment of the present invention, by setting a few variables such as making frequency or inductance matrix L to be zero, the new formulation can be easily implemented into static parameter extraction tools. This flexibility of the new formulation allows for easy transition from static circuit problem solving to the more complicated electromagnetic problem with high accuracy. Furthermore, the new formulation provides a balance of tradeoffs between accuracy and speed for in real circuit designs.

In accordance to another embodiment of the present invention, the novel formulation preserves the ability to use matrix compression techniques such as SVD method of S. Kapur, et al, IES3: A Fast Integral Solver for Efficient 3-Dimensional Extraction. In 37th International Conference on Computer Aided Design, November 1997.

All sub-matrices in the system matrix are sparse matrices, except for L and Φ. These dense matrices can be efficiently sampled and compressed in a hierarchical format. Compressing the dense matrix in a hierarchical format afford efficient use of computer memory and enables solving of large system matrixes with less computational resources. The system matrix can be solved by using an iterative linear matrix solver with the matrix-vector product computed at a dramatically reduced cost for large matrix. In accordance to an embodiment of the present invention, the new formulation includes the matrix-compression technique and iterative solving for enhanced computation efficiency even though traditional LU factorization method can also be used.

A property common among circuit simulations is that the circuit simulation is often repeatedly computed with some minor changes. A major cost of simulation can be saved by devising a strategy to smartly save and retrieve computed results. In accordance with a present embodiment, two formulas comprise the following computations:

$$L_{ij} = \frac{1}{T_L} \int_{Ci} \int_{Cj} G_A(r, r') dr dr'$$

-continued
$$\Phi_{ij} = \frac{1}{T_\phi} \int_{Qi} \int_{Qj} G_\phi(r, r') dr dr'$$

In analysis, the basic computation provides an integration over two regions to derive the interaction from source to field. Furthermore, since the multilayered full-wave Green's functions are reciprocal, the order of the two objects is interchangeable. A novel data caching mechanism is provided to take advantage of the properties exhibited for the computations based in part of the multilayered full-wave Greens's function. Accordingly, in accordance with an embodiment of the present invention, an efficient use of a data caching mechanism is disclosed with respect to FIG. 4.

Figure 4:
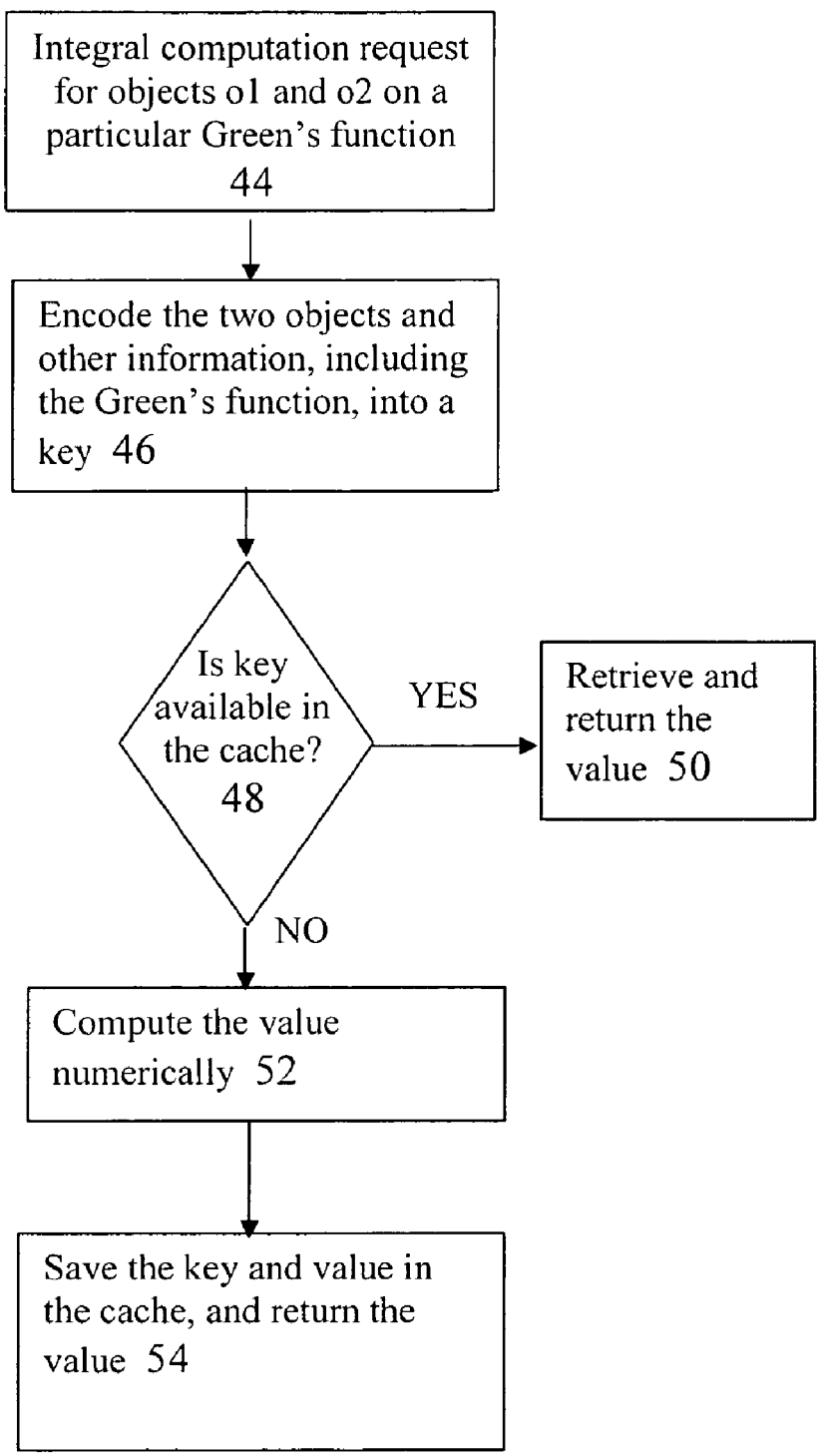
FIG. 4 is a flow diagram of a data caching mechanism in accordance with an embodiment of the present invention.

FIG. 4 shows a flowchart for an implementation of the novel data caching mechanism. In step 44, integral computation requests objects o1 and o2 for a particular multilayered full-wave Green's function. In step 46 the o1, o2 and other information are encoded in to a key stored in a cache. In step 48, an inquiry as to whether a key is available in the cache. If inquiry is yes, then in step 50, the key is retrieved along with a value. If the inquiry is no, then in step 52, a key and a value is computed numerically. Next, in step 54, the key is saved in cache and a value is returned for further computation.

An attribute of a successful data caching mechanism is to have a small-sized data cache without the burden of large overhead. According to the present embodiment, the caching mechanism encodes the two objects and other information into a key that does not add much overhead and can be saved in small-sized cache. Upon analysis, the encoding cannot be a simple hash function because the key clash may require that the objects to be saved causing a data cache to be unnecessarily large. However, using an MD5 digest function encoding method to generate a key for the two objects and other information, the likelihood of key clash is almost null. Moreover, the MD5 encoding is efficient and has minimal overhead compared with other encoding methods. In the data cache, the key and a value is saved and not the objects themselves which significantly reduces the size of the data cache.

In accordance to another embodiment of the present invention, transformation of the objects into a local coordination system further increases the effectiveness of the encoding for the data cache. Taking advantage of the symmetric and reciprocal properties of the Green's function and the symmetric property of the novel integral scheme, the two objects are transformed into a local coordination system. In rotating or flipping the coordination system, the smaller object can be set to a fixed quadrant for calculation purposes.

Figure 5:
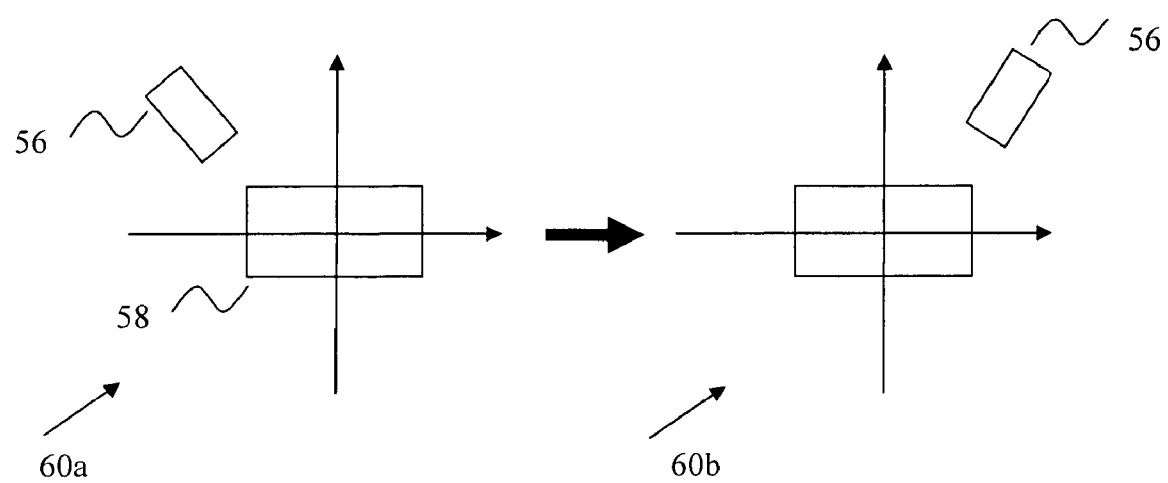
FIG. 5 is an illustration of rotating or flipping a coordination system.

FIG. 5 illustrates an example of rotating or flipping the coordination system to reduce encoding complexity. Object 56 and object 58 are to be encoded at a local coordinate system 60a. The smaller object 56 resides in the second quadrant of the local coordinate system 60a based on the larger object 58. Due to the symmetric property of the Green's functions, rotating and flipping the objects do not change the integral value, thus keeping the smaller object in the first quadrant reduces the number of keys and the cache size. Accordingly, the smaller object 56 is transformed to reside in the first quadrant of a fixed quadrant coordinate system 60b.

The data cache is saved to disk when a computation session executes and data is purged from data memory. During the next computation session, the data cache is loaded into the memory and the cached data is used for another computing session.

The data caching algorithm herein described can increase the speed of computation by a factor of 10 particularly when similar geometries have already been computed. As is often the case, circuit designs are done through a try-and-error method in a simulation environment, and thus the data caching method saves the computing time substantially.

While the foregoing detailed description has described several embodiments of the present invention, it is to be understood that the above description is illustrative only and not limiting of the disclosed invention. Obviously, many modifications and variations will be apparent to those skilled in the art without departing from the spirit of the invention.

I claim:

1. A method for simulating a circuit element, comprising the steps of:
   in a computer, discretizing said circuit element into charge elements and current elements;
   calculating electromagnetic interaction using one or more multilayer Green's functions on said charge elements and said current elements;
   generating electromagnetic interaction results as a function of electromagnetic interaction and using a partial element equivalent circuit PEEC method; and
   simulating the circuit element by using the generated electromagnetic interaction results;
   wherein the discretizing step, the calculating step and the generating step provide a system matrix.

2. The method according to claim 1 further including, after said discretizing step, a step of generating internal data structures to include the charge elements and the current elements wherein the internal data structures include multilayer Green's functions and PEEC incident matrices.

3. The method according to claim 2, wherein the step of generating an internal data structure includes generating a row of full current element equations.

4. The method according to claim 2, wherein the step of generating an internal data structure includes generating a row of charge conservation equations.

5. The method according to claim 2, wherein the step of generating an internal data structure includes generating a row of node voltage and auxiliary equations for modified nodal analysis.

6. The method according to claim 1, wherein the system matrix includes at least one submatrix for the electromagnetic interactions.

7. The method according to claim 6 further includes compressing the submatrix.

8. The method according to claim 1, wherein the system matrix is implicit.

9. The method according to claim 1 further includes matrix-stamping the internal data structures to provide the system matrix.

10. The method according to claim 1 further includes iterative solving of the system matrix.

11. The method according to claim 1, wherein the system matrix is:

$$\begin{bmatrix} -(R+j\omega L) & P_{LQ}\Phi & P_{LV} \\ S & j\omega & 0 \\ P_{VJ} & 0 & P_{VV} \end{bmatrix} \begin{bmatrix} J \\ Q \\ V \end{bmatrix} = \begin{bmatrix} 0 \\ 0 \\ V_S \end{bmatrix}.$$

12. The method according to claim 2 further includes data caching the internal data structures.

13. The method according to claim 12, wherein the step of data caching includes encoding a key from two objects of an integral computation during the calculating step.

14. The method according to claim 13, wherein the step of encoding a key includes MD5 encoding.

15. The method according to claim 14, wherein the step of data caching includes transforming an object to reside in a predetermined quadrant of a fixed quadrant coordinate system.

16. A method for simulating a circuit element, comprising the steps of:
   in a computer, discretizing said circuit element into charge elements and current elements;
   generating internal data structures to include the charge elements and the current elements wherein the internal data structures include multilayer Green's functions and partial element equivalent circuit (PEEC) incident matrices;
   calculating electromagnetic interaction using the multilayer Green's functions on said charge elements and said current elements;
   solving system equations as a function of electromagnetic interaction and using the PEEC incident matrices;
   generating electromagnetic results as a function of said system equations; and
   simulating the circuit element by using the generated electromagnetic results;
   wherein a system matrix for the system equations is:

$$\begin{bmatrix} -(R+j\omega L) & P_{LQ}\Phi & P_{LV} \\ S & j\omega & 0 \\ P_{VJ} & 0 & P_{VV} \end{bmatrix} \begin{bmatrix} J \\ Q \\ V \end{bmatrix} = \begin{bmatrix} 0 \\ 0 \\ V_S \end{bmatrix}.$$

17. A method for simulating a circuit element comprising the steps of:
   in a computer, discretizing said circuit element into charge elements and current elements;
   generating internal data structures to include the charge elements and the current elements wherein the internal data structures include Mixed-Potential Integral Equation Green's functions and Partial Element Equivalent Circuit (PEEC) incident matrices; and
   calculating a relationship between the charge elements and current elements using the Mixed-Potential Integral Equation Green's functions to provide electromagnetic interactions in the internal data structures; and
   simulating the circuit element as a function of the electromagnetic interactions in the internal data structures;
   wherein the discretizing step, the generating step, and the calculating step provide a system matrix.

* * * * *